(12) United States Patent
Ishikawa et al.

(10) Patent No.: US 10,834,861 B2
(45) Date of Patent: Nov. 10, 2020

(54) COMPONENT DETERMINATION DEVICE AND COMPONENT DETERMINATION METHOD (71) Applicant: FUJI CORPORATION, Chiryu (JP)

(72) Inventors: Nobuyuki Ishikawa, Nogoya (JP); Katsunori Tanaka, Kasugai (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 15/998,952

(22) PCT Filed: Feb. 18, 2016

(86) PCT No.: PCT/JP2016/054742
§ 371 (c)(1),
(2) Date: Dec. 11, 2018

(87) PCT Pub. No.: WO2017/141405
PCT Pub. Date: Aug. 24, 2017

(65) Prior Publication Data
US 2019/0239400 A1 Aug. 1, 2019

(51) Int. Cl.
*H05K 13/08* (2006.01)
*H05K 13/04* (2006.01)
(52) U.S. Cl.
CPC ..... *H05K 13/0815* (2018.08); *H05K 13/0409* (2018.08); *H05K 13/0465* (2013.01); *H05K 13/0812* (2018.08); *H05K 13/0813* (2018.08)
(58) Field of Classification Search
CPC ........... H05K 13/0812; H05K 13/0465; H05K 13/0815; H05K 13/0409
See application file for complete search history.

(56) References Cited

U.S. PATENT DOCUMENTS 10,575,451 B2 * 2/2020 Kito ................... H05K 13/0813
2002/0030736 A1 * 3/2002 Hudson .............. H05K 13/0815
348/86

(Continued)

FOREIGN PATENT DOCUMENTS

CN 104168752 A 11/2014
JP 7-249897 A 9/1995

(Continued)

OTHER PUBLICATIONS

Visco Technologies, Connector Inspection, Apr. 7, 2015, Visco Technologies website, http://www.visco-tech.com/english/algorithm/exclusive/ (Year: 2015).*

(Continued)

*Primary Examiner* — Hoa C Nguyen
*Assistant Examiner* — Keith DePew
(74) *Attorney, Agent, or Firm* — Oblon, McClelland, Maier & Neustadt, L.L.P.

(57) ABSTRACT

A component determination device and a component determination method for an electronic component, the component including a reference section formed as a different member to the multiple electrodes. The component determination device includes: a measuring device configured to measure positions of multiple reference points set on the reference section and a position of a measurement point set on each of the multiple electrodes; a plane calculating section configured to calculate a reference plane representing a position of the upper surface of the circuit board with respect to the component main body when the electronic component is mounted on the circuit board based on the positions of the multiple reference points; and a suitability determining section configured to determine whether the electronic component is suitable based on a distance (Continued)

between the reference plane and the multiple measurement points.

11 Claims, 6 Drawing Sheets

(56) References Cited

U.S. PATENT DOCUMENTS

| | | | | |
|---|---|---|---|---|
| 2002/0057830 | A1* | 5/2002 | Akin | G01R 31/309 |
| | | | | 382/147 |
| 2014/0119636 | A1* | 5/2014 | Nava | H05K 13/0815 |
| | | | | 382/147 |
| 2015/0286202 | A1* | 10/2015 | Amano | G05B 11/011 |
| | | | | 700/110 |
| 2016/0209207 | A1* | 7/2016 | Kim | G01B 11/0608 |
| 2018/0177087 | A1* | 6/2018 | Kito | H05K 13/0413 |
| 2018/0218486 | A1* | 8/2018 | Seo | G01B 11/26 |
| 2018/0242486 | A1* | 8/2018 | Sugita | G05B 19/401 |
| 2019/0037739 | A1* | 1/2019 | Okazaki | H05K 13/0409 |
| 2019/0045683 | A1* | 2/2019 | Suzuki | H05K 13/0818 |

FOREIGN PATENT DOCUMENTS

| | | | |
|---|---|---|---|
| JP | 10-246617 A | | 9/1998 |
| JP | 2001-155160 A | | 6/2001 |
| JP | 2001-196794 A | | 7/2001 |
| JP | 2001196794 A | * | 7/2001 |
| JP | 2010266205 A | * | 11/2010 |
| JP | 2011-228583 A | | 11/2011 |
| JP | 2018098404 A | * | 6/2018 |

OTHER PUBLICATIONS

"Connector Inspection", ViSCO Technologies, XP55543005A, 2012, pp. 1-8.
International Search Report dated May 17, 2016 in PCT/JP2016/054742 filed Feb. 18, 2016.

* cited by examiner

COMPONENT DETERMINATION DEVICE AND COMPONENT DETERMINATION METHOD

TECHNICAL FIELD

The present application relates to a component determination device and a component determination method.

BACKGROUND ART

A component inspection device determines whether, for an electronic component to be mounted on a circuit board, the state of the electrodes on the electronic component and the like are suitable for the usage of the electronic components. For example, in patent literature 1 a configuration is disclosed for performing flatness inspection for multiple electrodes (leads or the like). By determining whether the electronic component is acceptable or not, it is possible to prevent electronic components with defects such as deformed electrodes from being mounted on a circuit board.

CITATION LIST

Patent Literature

Patent literature 1: JP-A-2001-155160

BRIEF SUMMARY

Technical Problem

However, there are components that include contact sections that contact the upper surface of a circuit board other than electrodes. The above contact sections, for example, are used for positioning an electronic component with respect to the circuit board, or maintaining the posture of electronic components mounted on the circuit board. For such an electronic component including a contact section, even if the flatness of electrodes is normal, it may not be appropriate to mount the component on the circuit board based on the positional relationship between the electrodes and the contact section.

The present disclosure takes account of such circumstances, and an object thereof is to provide a component determination device and a component determination method that improve the accuracy of determining whether an electronic component is good or not in accordance with the type of electronic component.

Solution to Problem

A component determination device of the present disclosure determines whether an electronic component is suitable to be mounted on a circuit board. The electronic component includes: a component main body; multiple electrodes; and a reference section that is formed as a different member to the multiple electrodes and that contacts an upper surface of the circuit board when the electronic component is mounted on the circuit board. The component determination device includes: a measuring device configured to measure positions of multiple reference points set on the reference section and a position of a measurement point set on each of the multiple electrodes; a plane calculating section configured to calculate a reference plane representing a position of the upper surface of the circuit board with respect to the component main body when the electronic component is mounted on the circuit board based on the positions of the multiple reference points; and a suitability determining section configured to determine whether the electronic component is suitable based on a distance between the reference plane and the multiple measurement points.

A component determination device of the present disclosure determines whether an electronic component is suitable to be mounted on a circuit board. The electronic component includes: a component main body; multiple electrodes lined up in a row in the horizontal direction; and a reference section that is formed as a different member to the multiple electrodes and that is arranged lined up on the same row as the multiple electrodes when the electronic component is viewed from above. The component determination device includes: a measuring device configured to measure positions of multiple reference points set on the reference section and a position of a measurement point set on each of the multiple electrodes; a plane calculating section configured to calculate a reference plane representing a position of the upper surface of the circuit board with respect to the component main body when the electronic component is mounted on the circuit board based on the positions of the multiple reference points; and a suitability determining section configured to determine whether the electronic component is suitable based on a distance between the reference plane and the multiple measurement points.

A component determination method of the present disclosure determines whether an electronic component is suitable to be mounted on a circuit board. The electronic component includes: a component main body; multiple electrodes; and a reference section that is formed as a different member to the multiple electrodes and that contacts an upper surface of the circuit board when the electronic component is mounted on the circuit board. The component determination method includes: measuring positions of multiple reference points set on the reference section and a position of a measurement point set on each of the multiple electrodes; calculating a reference plane representing a position of the upper surface of the circuit board with respect to the component main body when the electronic component is mounted on the circuit board based on the positions of the multiple reference points; and determining whether the electronic component is suitable based on a distance between the reference plane and the multiple measurement points.

A component determination method of the present disclosure determines whether an electronic component is suitable to be mounted on a circuit board. The electronic component includes: a component main body multiple electrodes lined up in a row in the horizontal direction; and a reference section that is formed as a different member to the multiple electrodes and that is arranged lined up on the same row as the multiple electrodes when the electronic component is viewed from above. The component determination method includes: measuring positions of multiple reference points set on the reference section and a position of a measurement point set on each of the multiple electrodes; calculating a reference plane representing a position of the upper surface of the circuit board with respect to the component main body when the electronic component is mounted on the circuit board based on the positions of the multiple reference points; and determining whether the electronic component is suitable based on a distance between the reference plane and the multiple measurement points.

Advantageous Effects

According to the configuration of the present disclosure, it is determined whether an electronic component is suitable to be mounted on a circuit board, the electronic component including a reference section that contacts an upper surface of the circuit board. Based on multiple reference points set on the reference section, a reference plane to be used in the determination is calculated. Thus, it is possible to reflect the position of the reference section contacting the circuit board when determining whether the electronic component is suitable. Thus, it is possible to improve the accuracy of determining whether the electronic component is suitable in accordance with a state of the electronic component including a portion that contacts an upper surface of the circuit board.

According to the present disclosure, it is determined whether an electronic component is suitable, the electronic component including a reference section arranged lined up in a row with multiple electrodes arranged lined up in a horizontal direction. Based on multiple reference points set on the reference section, a reference plane to be used in the determination is calculated. Thus, it is possible to reflect the position of the reference section close to the electrode when determining whether the electronic component is suitable. Accordingly, it is possible to improve the accuracy of determining whether the electronic component is suitable in accordance with a state of the electronic component including a portion arranged lined up in a row with multiple electrodes.

DESCRIPTION OF EMBODIMENTS

An embodiment of the component determination device and component determination method of the present disclosure are described below with reference to the figures. The component determination device is applied to an electronic component mounter and determines the suitability of an electronic component being held by a mounting head of a component transfer device in the electronic component mounter. The electronic component mounter is a device for picking up an electronic component at a supply position using a suction nozzle or a chuck device and mounting the electronic component at a specified coordinate position on a circuit board.

Embodiment

1. Overall Configuration of Electronic Component Mounter 1

Figure 1:
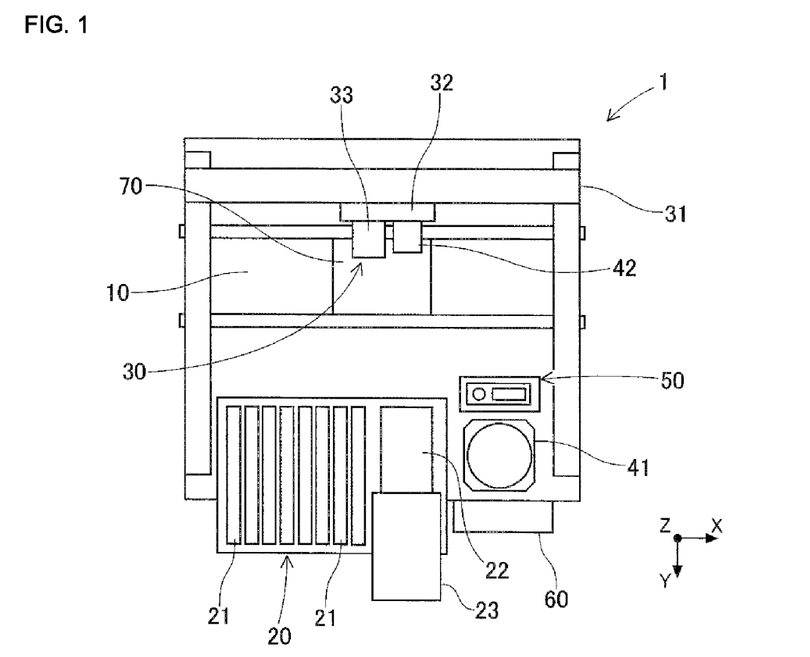
FIG. 1 is a plan view showing an overall view of an electronic component mounter of an embodiment.

As shown in FIG. 1, electronic component mounter 1 is provided with board conveyance device 10, component supply device 20, component transfer device 30, component camera 41, board camera 42, measuring device 50, and control device 60. In the descriptions below, the horizontal width direction of electronic component mounter 1 (left-right direction in FIG. 1) is the X-axis direction, the horizontal depth direction of electronic component mounter 1 (up-down direction in FIG. 1) is the Y-axis direction, and the direction perpendicular to the X axis and Y axis (perpendicular to the page in FIG. 1) is the Z-axis direction.

Board conveyance device 10 is configured from a belt conveyor or the like and consecutively conveys circuit boards 70 in a conveyance direction. Board conveyance device 10 positions circuit board 70 at a specified position inside electronic component mounter 1. Then, after mounting processing has been performed by electronic component mounter 1, board conveyance device 10 unloads circuit board 70 from electronic component mounter 10.

Component supply device 20 supplies electronic components to be mounted on circuit board 70. Component supply device 20 includes multiple slots arranged lined up in the X direction. Feeders 21 are removably set in each of the multiple slots. Component supply device 20 supplies electronic components to a removal section positioned at the leading end of feeder 21 (the upper side in FIG. 1) by feeder 21 indexing carrier tape.

Also, component supply device 20, for example, supplies relatively large electronic components such as leaded components in a state lined up on tray 22. Component supply device 20 stores multiple trays 22 in a storage rack divided in the vertical direction, and pulls forward a specified tray 22 according to mounting processing so as to supply electronic components such as leaded components.

Component transfer device 30 is configured to move in the X direction and the Y direction. Component transfer device 30 is arranged from the rear side in the lengthwise direction of electronic component mounter 1 (the upper side in FIG. 1) to above component supply device 20 at the front of electronic component mounter 1. Component transfer device 30 is provided with head driving device 31, moving body 32, and mounting head 33. Head driving device 31 is configured to move moving body 32 in the XY directions using a linear motion mechanism.

Mounting head 33 is removably provided on moving body 32 of head driving device 31. Among mounting heads 33, there is a type that uses suction nozzles (not shown) and a type that uses a chuck device (not shown). A head station (not shown) that stores multiple types of mounting heads 33 is arranged inside electronic component mounter 1. Mounting head 33, for example, is selected appropriately according to the type of electronic component mounted on circuit board 70, with mounting heads 33 on moving body 32 being exchanged automatically or by manual operation of an operator.

A mounting head 33 that uses suction nozzles holds multiple suction nozzles on multiple nozzle holders, the suction nozzles being detachably attached. Mounting head 33 holds each suction nozzle such that the suction nozzles can be revolved around an R axis parallel to the Z axis, and rotated around a θ axis that passes through a center of suction nozzle and is parallel to the Z axis. Each suction nozzle has supply conditions such as raising/lowering position (Z-axis direction position) and angle with respect to mounting head 33, and supply of negative pressure, controlled. The suction nozzles, by being supplied with negative pressure, pick up and hold an electronic component supplied to a removal section of feeder 21.

A mounting head 33 that uses a chuck device holds a chuck device (not shown) that grips an electronic component. The mounting head 33 holds chuck devices such that each is rotatable around a θ axis parallel to the Z axis, and capable of being raised and lowered. The chuck device, for example, includes a pair of gripping claws arranged opposite each other in a horizontal direction. The chuck device grips an electronic component by making the gap between the pair of gripping claws a specified distance using driving force supplied from mounting head 33. According to such a configuration, the chuck device grips and holds an electronic component supplied from tray 22.

Component camera 41 and board camera 42 are digital cameras with an imaging element such as a charge coupled device (CCD) or a complementary metal oxide semiconductor (CMOS). Component camera 41 and board camera 42 each perform imaging of a visual field range based on a control signal from control device 60 that is connected to component camera 41 and board camera 42 such that communication is possible, and transmit image data acquired from the imaging operation to control device 60.

Component camera 41 is fixed to a base of electronic component mounter 1 such that a light axis is aligned in the vertical direction (Z-axis direction), and is configured to be able to image component transfer device 30 from below. More specifically, component camera 41 is configured to be able to image the bottom surface of an electronic component being held by a suction nozzle or chuck device. Board camera 42 is fixed to moving body 32 of component transfer device 30 such that the light axis faces down in a vertical direction (the Z-axis direction). Board camera 42 is configured to be able to image circuit board 70.

Figure 3A:
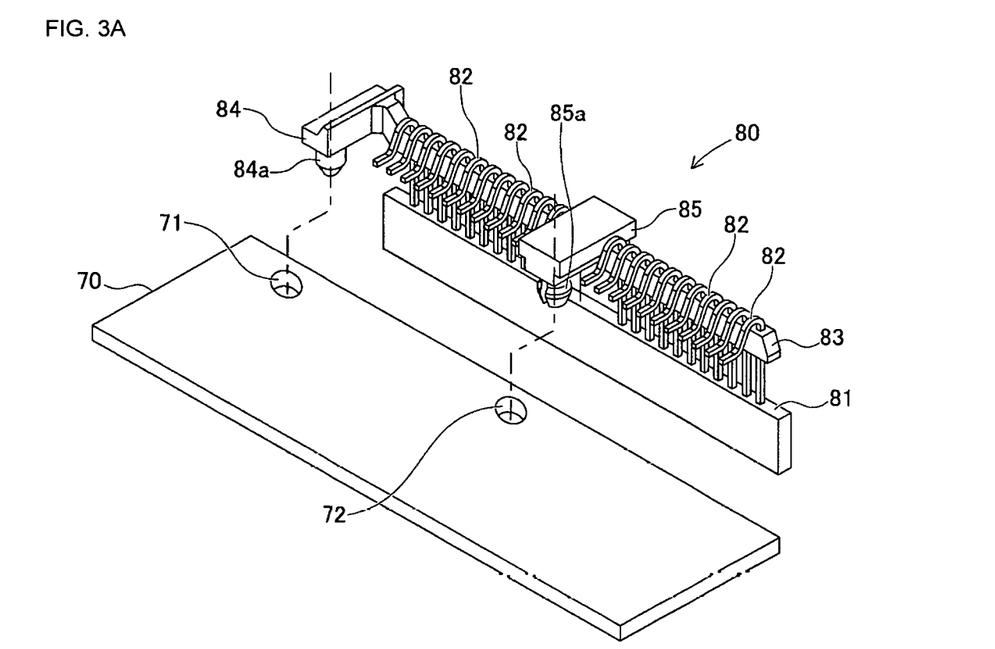
FIG. 3A is a perspective view showing an electronic component and a circuit board.

Control device 60 that has acquired image data from board camera 42, for example, recognizes the positioning state of circuit board 70 by board conveyance device 10 by recognizing positioning marks provided on the board 70 by image processing. Then, control device 60 corrects the position of moving body 32 according to the positioning state of circuit board 70, and controls mounting processing such that mounting of the electronic components is performed. Further, as shown in FIG. 3A, board camera 42 acquires image data to be used in position recognition of positioning hole 71 and stopping hole 72 provided at specified positions in circuit board 70.

Measuring device 50 measures the positions of measurement points provided on a measured body fixed to the base of electronic component mounter 1 and positioned above measuring device 50. In the present embodiment, measuring device 50 emits laser light up from laser emitter 51 and laser light reflected by the measured body collects at light receiver 52. Measuring device 50 measures the distance from measuring device 50 to the measurement point of the measured body based on the strength of the light collected to light receiver 52. And, measuring device 50 measures the position of the measuring point based on the distance to the measurement point of the measured body and the position coordinates of the measured body positioned above Measuring device 50 is used to measure the position of electrodes of an electronic component with the electronic component held by mounting head 33 being the measured body. In the present embodiment, measuring device 50 is configured from component determining device Dp that determines whether the electronic component is suitable. Note that, measuring device 50 may be realized in various forms other than the above laser type, so long as measuring device 50 is capable of measuring the position of the measurement point. For example, measuring device 50 may be configured to measure a three-dimensional position of each measurement point by measuring the form (three-dimensional shape) of the bottom surface of the electronic component as represented by three-dimensional coordinates.

Figure 2:
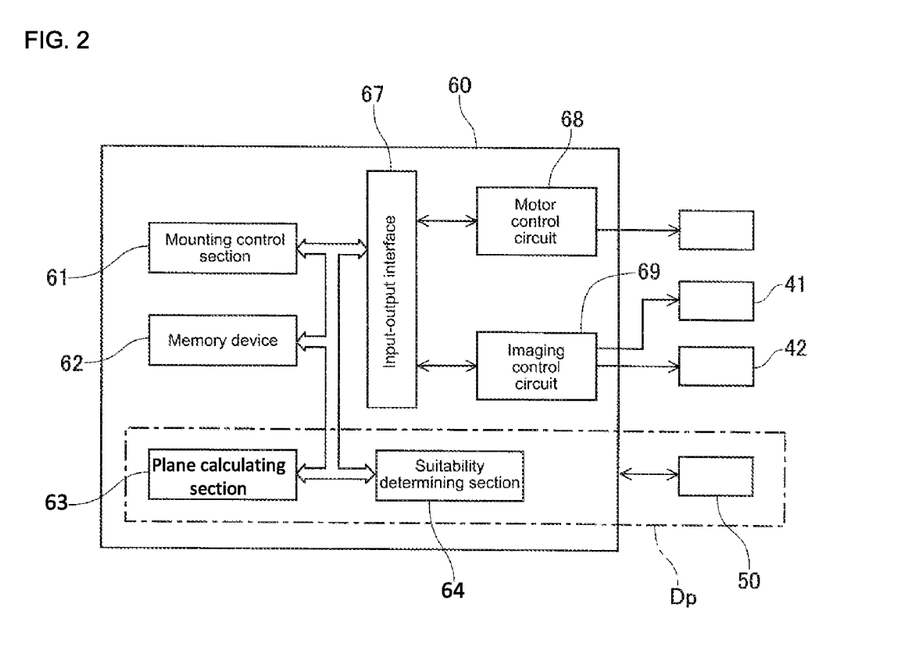
FIG. 2 shows a control device of an electronic component mounter and component determining device.

Control device 60 is configured mainly from a CPU, various types of memory, and control circuits. Control device 60 controls mounting processing of mounting electronic components on circuit board 70 based on a determination result of whether an electronic component is suitable by component determination device Dp, which is described later, and image data acquired from images of component camera 41 and board camera 42. As shown in FIG. 2, control device 60 is configured with mounting control section 61, memory device 62, plane calculating section 63, and suitability determining section 64 connected to input-output interface 67 via a bus. Motor control circuit 68 and imaging control circuit 69 are connected to input-output interface 67.

Mounting control section 61 controls the position and operation of mounting head 33 via motor control circuit 68. Specifically, mounting control section 61 receives information outputted from various sensors provided on electronic component mounter 1, and results of various recognition processing. Then, mounting control section 61 sends control signals to motor control circuit 68 based on a control program memorized in memory device 62, information from the various sensors, and the results of image processing and recognition processing. By this, the position and rotation angle of the suction nozzle or chuck device supported on mounting head 33 are controlled.

Memory device 62 is configured from an optical drive device such as a hard disk device, flash memory, or the like. Memory device 62 memorizes a control program for operating electronic component mounter 1, image data sent from component camera 41 or board camera 42 to control device 60 via a bus or communication cable, temporary data of image processing by component determination device Dp, and the like. Plane calculating section 63 and suitability determining section 64 configure the component determination device Dp described later, so details are given later in the descriptions of the configuration of component determination device Dp. Input-output interface 67 converts the data type or adjusts the signal strength between the CPU or memory device 62 and each control circuit 76 or 77.

Motor control circuit 68 is used for controlling each axis motor provided in component transfer device 30 based on control signals from mounting control section 61. By this, the position of mounting head 33 is decided in each axis direction. Also, by control of the motor of each axis, the raising and lowering position (Z-axis direction position) and rotation angle of a suction nozzle or chuck device is decided. Imaging control circuit 69 controls imaging by component camera 41 and board camera 42 based on imaging control signals sent by control device 60. Also, imaging control circuit 69 acquires image data from imaging by component camera 41 and board camera 42 and memorizes the image data on memory device 62 via input-output interface 67.

2. Component Determination Device Dp and Electronic Component 80

Component determination device Dp determines the suitability of electronic components. In the present embodiment, component determination device Dp is configured to be integrated as a part of electronic component mounter 1. Component determination device Dp is applied to determine the suitability of an electronic component held by mounting head 33 of component transfer device 30.

Here, the electronic component for which component determination device Dp is to determine the suitability of is an electronic component with a component main body and multiple electrodes. The electrodes of the electronic component are provided on the component main body and are electrically connected to lands of circuit board 70 after the electronic component has been mounted on circuit board 70. Specifically, the electrodes are leads of leaded components, or protruding terminals of chip components. Descriptions are given below using electronic component 80, which is a leaded component, as a target for suitability determination.

2-1. Detailed Configuration of Electronic Component 80

Figure 3B:
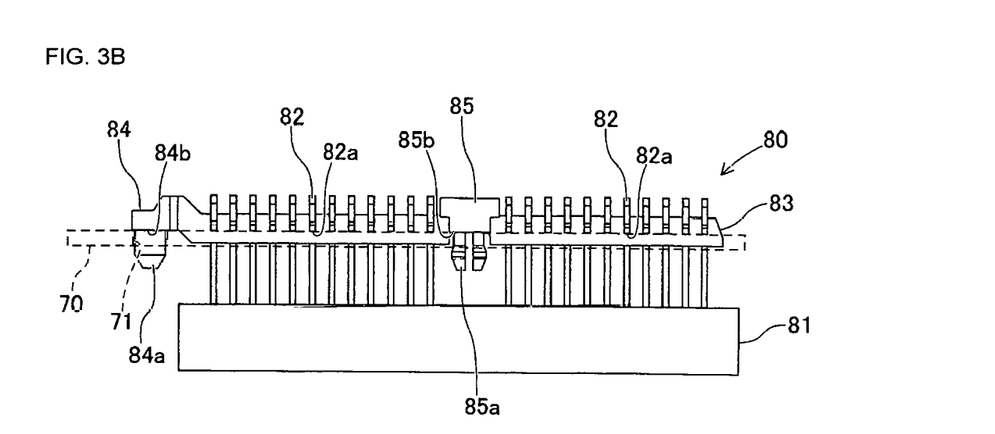
FIG. 3B is a side view of the electronic component of FIG. 3A.

As shown in FIGS. 3A and 3B, electronic component 80 includes component main body 81, multiple electrodes 82, and connecting member 83. Component main body 81 is box-shaped. Each of the multiple electrodes 82 is lined up in a row in a horizontal direction. Electrodes 82 extend upwards from component main body 81 and are formed folded over into a curve shape at a top portion. Also, the tips of electrodes 82 are formed extending in a horizontal direction to be capable of contacting an upper surface of circuit board 70.

Connecting member 83 connects the multiple electrodes 82 at a position separated from component main body 81. Connecting member 83 is formed as a separate member from component main body 81 and the multiple electrodes 82. First reference section 84 and second reference section 85 are formed on a portion of connecting member 83. In the present embodiment, first reference section 84 and second reference section 85 are portions that contact an upper surface of circuit board 70 when electronic component 80 is mounted on circuit board 70.

First reference section 84 and second reference section 85 are each arranged in a row with the multiple electrodes 82 when viewing electronic component 80 from above. Here, the arrangement direction (the left-right direction in FIG. 3C) of the multiple electrodes 82 is parallel and the region sandwiched by a pair of straight lines (single dashed lines in FIG. 3C) that is the smallest width that encloses all of the multiple electrodes 82 is defined as "Lead row F". First reference section 84 and second reference section 85 are each arranged in a row with the multiple electrodes 82 with at least a portion being included in lead row F.

First reference section 84 is arranged at the end in the arrangement direction with respect to the multiple electrodes 82. First reference section 84 includes pin section 84a and regulating surface 84b. Pin section 84a is inserted into positioning hole 71 of circuit board 70. Electronic component 80 is positioned in the XY directions with respect to circuit board 70 by pin section 84a being inserted into positioning hole 71 formed at a specified position on circuit board 70. As shown in FIG. 3B, regulating surface 84b of first reference section 84 contacts an upper surface of circuit board 70 when pin section 84a is inserted by a specified amount into positioning hole 71, such that relative movement of pin section 84a with respect to positioning hole 71 is regulated.

Second reference section 85 is arranged between two adjacent electrodes 82 among the multiple electrodes 82. Second reference section 85 includes stopping claw 85a and regulating surface 85b. Here, as shown in FIG. 3A, circuit board 70 is provided with stopping hole 72 that pierces circuit board 70 in the thickness direction (vertical direction of FIG. 3A). As shown in FIG. 3B, stopping claw 85a is inserted through stopping hole 72 of circuit board 70 and engages with the lower surface of circuit board 70. By this, stopping claw 85a prevents pin section 84a inserted into positioning hole 71 of circuit board 70 from coming out. Also, similar to regulating surface 84b of first reference section 84, regulating surface 85b of second reference section 85 contacts an upper surface of circuit board 70 when stopping claw 85a has been inserted by a specified amount in stopping hole 72, such that relative movement of stopping claw 85a with respect to stopping hole 72 is regulated.

During mounting processing of electronic component mounter 1, electronic component 80 according to the above configuration is attached to circuit board 70 such that pin section 84a is inserted into positioning hole 71 and stopping claw 85a is inserted into stopping hole 72. Electronic component 80 mounted on circuit board 70 in this manner is positioned in the XY directions with respect to circuit board 70 via pin section 84a and stopping claw 85a, and the posture of electronic component 80 is maintained via stopping claw 85a. Also, each of the multiple electrodes 82 is positioned so as to be electrically connectable to the multiple lands formed on the upper surface of circuit board 70.

2-2. Detailed Configuration of Component Determination Device Dp

Figure 3C:
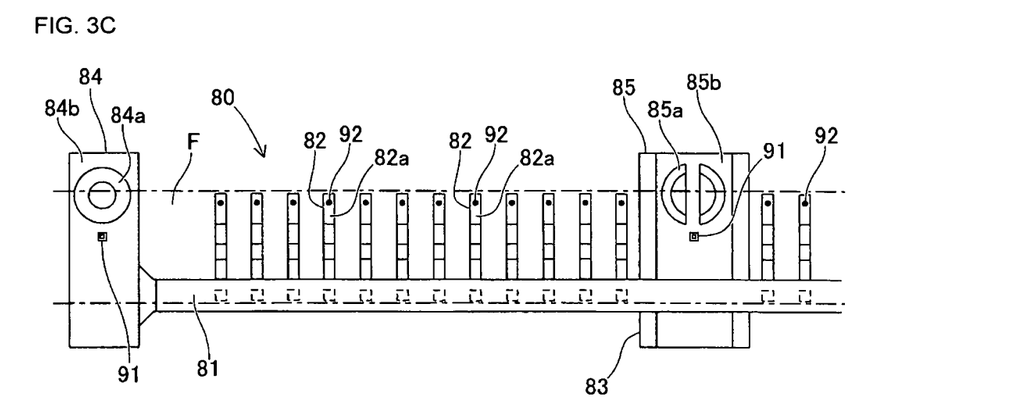
FIG. 3C is a bottom view of the electronic component of FIG. 3A.

As shown in FIG. 2, component determination device Dp is provided with measuring device 50, plane calculating section 63, and suitability determining section 64. Measuring device 50 measures the positions of the two reference points 91 and multiple measurement points 92 set on electronic component 80. In the present embodiment, as shown in FIG. 3C, multiple reference points 91 are set, one each for regulating surface 84b of first reference section 84 and regulating surface 85b of second reference section 85. Also, multiple measurement points 92 are set, one each on the lower surface (also referred to as "lead lower surface 82a") of the end of the multiple electrodes 82.

Plane calculating section 63 calculates reference plane 86 of electronic component 80 based on the positions of the multiple reference points 91. Here, reference plane 86 is an imaginary plane representing positions of the upper surface of circuit board 70 with respect to component main body 81 when electronic component 80 is mounted on circuit board 70. In the present embodiment, reference plane 86 is defined as a plane including a straight line that passes through the two reference points 91 and a straight line perpendicular to that line and parallel to the horizontal plane (XY plane). Further, plane calculating section 63 may be configured to calculate reference plane 86 based on three or more reference points 91.

Figure 4:
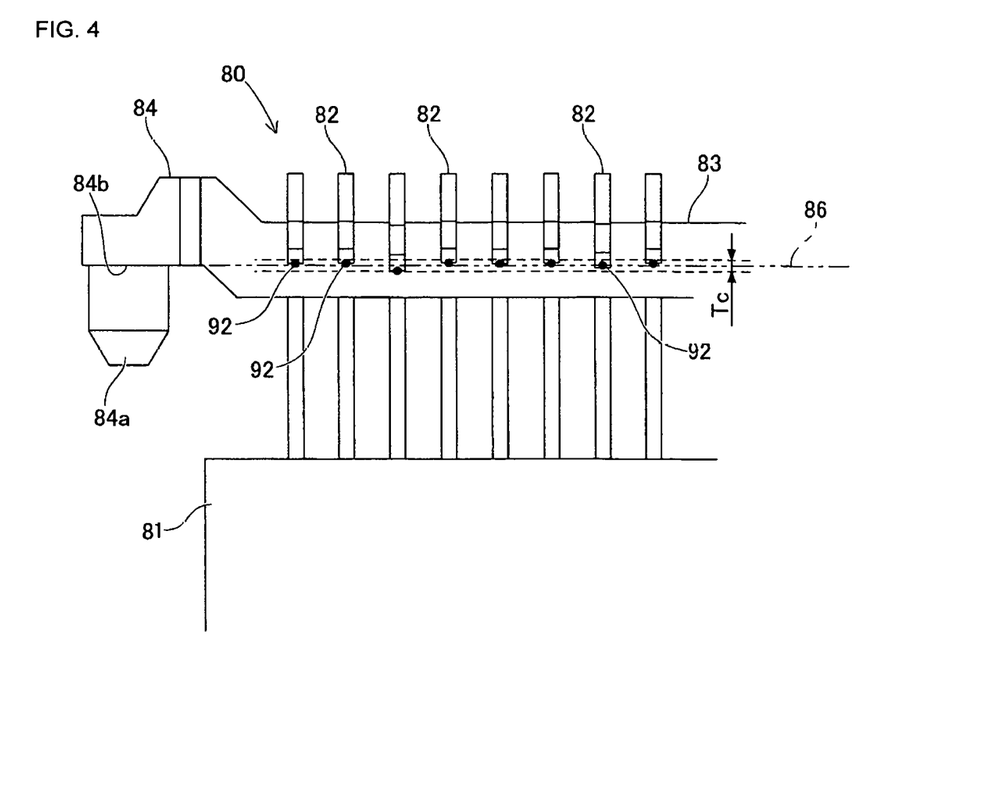
FIG. 4 is an enlarged view of the electronic component for illustrating determining suitability.

Suitability determining section 64 determines the suitability of electronic component 80 (determines whether the electronic component 80 is suitable to be mounted on circuit board 70) based on the distance between reference plane 86 and the multiple measurement points 92. In detail, as shown in FIG. 4, suitability determining section 64 determines whether each of the measurement points 92 of the multiple electrodes 82 falls within tolerance range Tc based on a tolerance value added to reference plane 86. Electrodes 82 of an electronic component 80 that is determined to be suitable have a flatness regulated to a specified level.

The flatness of electrodes 82 also reflects how uniform the lower surfaces of the electrode ends are, and is evaluated by the deformation amount of each electrode 82. For example, an electronic component 80 with one electrode 82 deformed such that the electrode 82 cannot be electrically connected does not have sufficient electrode flatness. Note that, component determination device Dp of the present disclosure guarantees the flatness of the multiple electrodes 82 by performing a suitability determination using reference plane 86 as above.

Compared to a configuration that performs normal flatness inspection of inspecting the flatness of, for example, multiple electrodes 82 only, the configuration above is able to decrease the error in accordance with the calculating of the imaginary plane (reference plane 86 in the present embodiment) used as a reference. In this manner, by using a characteristic of electronic component 80 of being included with a portion (regulating surfaces 84b and 85b) that contacts circuit board 70, normal flatness inspection can be omitted, and it is possible to determine the suitability of electronic components 80 with greater accuracy.

However, with conventional suitability determination of a leaded component, in addition to the above flatness inspection, there are cases in which the determination is based on the results of lead height and lead angle inspection. "Lead height" corresponds to the distance from a given set reference surface of electronic component 80 to the lower surface of the tip of electrode 82. Further, "lead angle" corresponds to the angle between a plane calculated based on the position of measurement points 92 set on electrodes 82 and the above reference surface.

During conventional suitability determination of a leaded component, there are cases in which performing inspection of the lead height and the lead angle are not appropriate for mounting processing, such as when there is a uniform curve in the multiple electrodes 82 that maintains the flatness level, or when a portion other than a lead gets too close to or contacts circuit board 70. In contrast the electronic component 80 that is a target for suitability determination by component determination device Dp of the present disclosure includes a portion (regulating surfaces 84b and 85b) that contacts an upper surface of circuit board 70 when mounted on circuit board 70, and is positioned with respect to circuit board 70 by pin section 84a and stopping claw 85a.

With such an electronic component 80, in a case in which each measurement point 92 of the multiple electrodes 82 is within tolerance range Tc, all the lead lower surfaces 82a are able to be electrically connected to the lands of circuit board 70 when regulating surfaces 84b and 85b of electronic component 80 contact the upper surface of circuit board 70. Thus, suitability determining section 64 allows lead height and lead angle inspections to be omitted, in addition to omitting the usual flatness inspection. Note that, the configuration may be such that for electronic component 80 of the present embodiment, for example, for preventing component main body 81 coming too close to or contacting circuit board 70, there may be an additional determination based on the positional relationship of component main body 81 and each of the tips of the multiple electrodes 82.

3. Mounting Processing by Electronic Component Mounter 1

Figure 5:
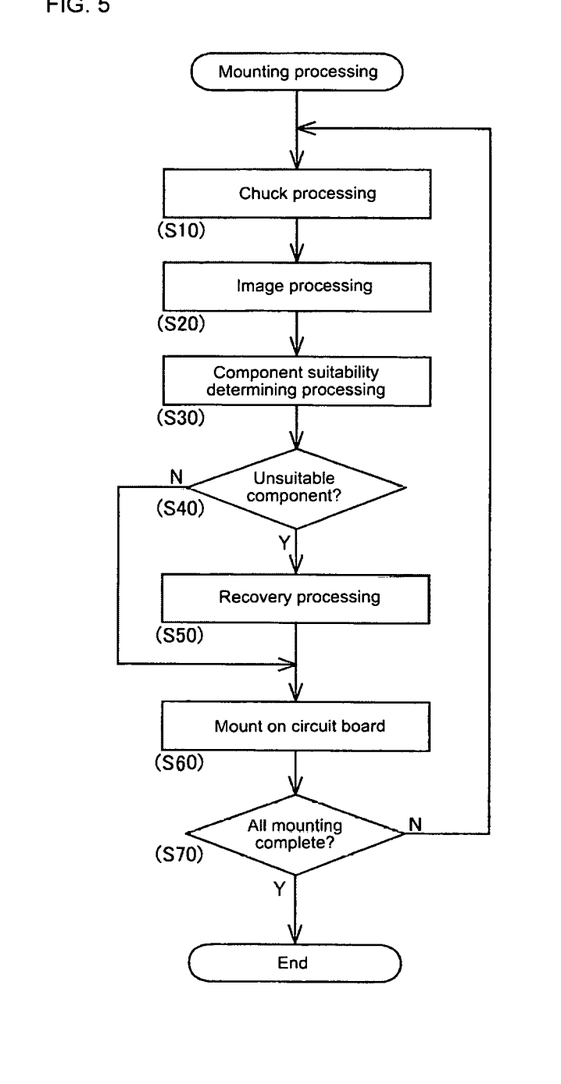
FIG. 5 is a flowchart showing mounting processing by the electronic component mounter.

Mounting processing by electronic component mounter 1 is described with reference to FIG. 5. During mounting processing of electronic component 80 mounting control section 61, first, performs chuck processing (step 10 [hereinafter, "step" is abbreviated to "S"]) of holding electronic component 80 by gripping electronic component 80 using a chuck device held by mounting head 33. Next, control device 60 performs image processing (S20) of operating component transfer device 30 to move mounting head 33 above component camera 41 and imaging the gripped electronic component 80.

Component determination device Dp performs suitability determining processing (S30) on the electronic component 80 held by the chuck device. This suitability determining processing may be performed only when the electronic component 80 gripped by the chuck device is an electronic component that requires suitability determination, such as a leaded component. Control device 60 determines whether the component is unsuitable based on a determination result of suitability determining processing. During the suitability determining processing, in a case in which recovery processing is requested for an unsuitable component (S40: yes), control device 60 performs recovery processing (S50).

Included in the above recovery processing are repair or disposal of an electronic component 80 determined to be unsuitable during mounting processing, gripping a required electronic component 80 again, performing suitability determining processing again, and the like. After performing recovery processing, or in a case in which it is determined in suitability determining processing that there is no unsuitable component (S40: no), mounting control section 61 mounts electronic component 80 on circuit board 70 (S60). Then, mounting control section 61, based on a control program, determines whether mounting of all electronic components 80 on circuit board 70 has been completed (S70). Control device 60 repeats the above processing (S10 to S60) until all mounting is complete.

Note that, during processing for mounting electronic component 80 on circuit board 70 (S60), mounting control section 61 recognizes the positions of pin section 84a and stopping claw 85a of electronic component 80 based on image data acquired during imaging processing (S20). Further, mounting control section 61 recognizes the positions of positioning hole 71 and stopping hole 72 of circuit board 70 based on image data acquired from imaging by board camera 42. Also, mounting control section 61 attaches electronic component 80 to circuit board 70 by lowering the electronic component 80 while adjusting the position and posture of the electronic component 80 such that pin section 84a is aligned with positioning hole 71 and stopping claw 85a is aligned with stopping hole 72.

4. Suitability Determining Processing by Component Determination Device Dp

Figure 6:
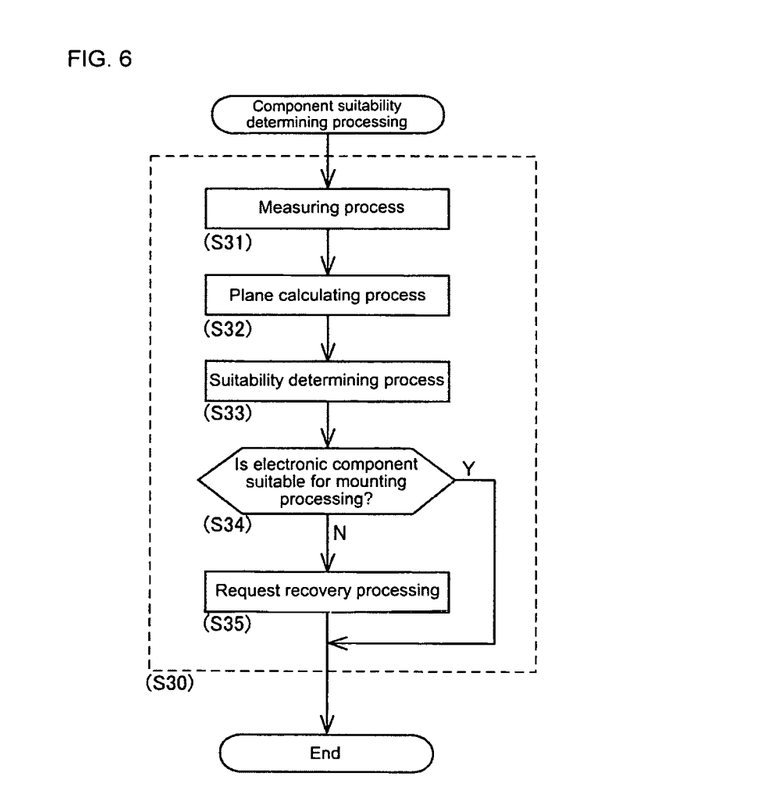
FIG. 6 is a flowchart showing suitability determining processing by the component determination device.

Suitability determining processing (S30) by component determination device Dp is described with reference FIG. 6. During suitability determining processing (S30), component determination device Dp, first, performs a measuring process of measuring the position of multiple reference points 91 and multiple measurement points 92 set on electronic component 80 using measuring device 50 (S31).

In detail, component determination device Dp recognizes a gripping state of electronic component 80 gripped by a chuck device of mounting head 33 based on image data acquired during imaging processing (S20). Further, component determination device Dp operates component transfer device 30 in accordance with the gripping state of the electronic component 80 and positions the multiple reference points 91 and multiple measurement points 92 above measure device 50 sequentially one by one. While doing this, component determination device Dp measures the positions of the positioned reference points 91 and measurement points 92 using measuring device 50.

Next, plane calculating section 63 performs a plane calculating process of calculating reference plane 86 of electronic component 80 based on the positions of the multiple reference points 91 (S32). Specifically, plane calculating section 63 calculates reference plane 86 as a plane including a straight line that passes through the two reference points 91 and a straight line perpendicular to that line and parallel to the horizontal plane (XY plane). Continuing, suitability determining section 64 performs a suitability determining process for electronic component 80 based on the distances between reference plane 86 and measured points 92 set on each of the multiple electrodes 82 (S33).

Suitability determining section 64, if determining that all the measurement points 92 set on each of the multiple electrodes 82 are within tolerance range Tc, determines that the electronic component 80 is suitable for mounting processing (S34: yes). On the other hand, if determining that one of the measurement points 92 set on each of the multiple electrodes 82 is not within tolerance range Tc, suitability determining section 64 determines that the electronic component 80 is not suitable for mounting processing (S34: no). Then, component determination device Dp requests recovery processing with respect to control device 60 (S35) and ends suitability determining with respect to the electronic component 80.

5. Effects of Embodiments

Component determination device Dp determines whether an electronic component 80 is suitable to be mounted on a circuit board 70. Electronic component 80 includes: component main body 81; multiple electrodes 82; and a reference section (first reference section 84, second reference section 85) that is formed as a different member to the multiple electrodes 82 and that contacts an upper surface of circuit board 70 when the electronic component 80 is mounted on the circuit board 70. Component determination device Dp includes: measuring device 50 configured to measure positions of multiple reference points 91 set on the reference section (first reference section 84 and second reference section 85) and a position of measurement point 92 set on each of the multiple electrodes 82; plane calculating section 63 configured to calculate reference plane 86 representing a position of the upper surface of the circuit board 70 with respect to component main body 81 when the electronic component 80 is mounted on the circuit board 70 based on the positions of the multiple reference points 91; and suitability determining section 64 configured to determine whether the electronic component 80 is suitable based on a distance between reference plane 86 and the multiple measurement points 92.

A component determination method (S30) determines whether an electronic component 80 is suitable to be mounted on a circuit board 70. Electronic component 80 includes: component main body 81; multiple electrodes 82; and a reference section (first reference section 84, second reference section 85) that is formed as a different member to the multiple electrodes 82 and that contacts an upper surface of circuit board 70 when the electronic component 80 is mounted on the circuit board 70. The component determination method (S30) includes: measuring positions of multiple reference points 92 set on the reference section (first reference section 84, second reference section 85) and a position of measurement point 92 set on each of the multiple electrodes 82; calculating reference plane 86 representing a position of the upper surface of circuit board 70 with respect to component main body 81 when electronic component 80 is mounted on circuit board 70 based on the positions of the multiple reference points 92; and determining whether the electronic component 80 is suitable based on a distance between reference plane 86 and the multiple measurement points 92.

According to such a configuration, it is determined whether an electronic component 80 is suitable to be mounted on a circuit board 70, the electronic component including a portion that contacts an upper surface of the circuit board 70. Also, electronic component 80, for having suitability determined, is set with multiple reference points 91 on first reference section 84 and second reference section 85 that contacts the upper surface of circuit board 70. Further, reference plane 86 calculated based on the multiple reference points 91 is an imaginary plane on the upper surface of circuit board 70 in a case in which electronic component 80 is hypothetically mounted on circuit board 70. Because reference plane 86 is calculated based on the multiple reference points 91, it is possible to calculate a more appropriate reference plane 86. Also, the suitability of electronic component 80 is determined based on the distance between reference plane 86 and the multiple measurement points 92. Thus, it is possible to reflect the position of the portion that contacts circuit board 70 when determining whether the electronic component 80 is suitable. Accordingly, it is possible to improve the accuracy of determining whether an electronic component 80 is suitable in accordance with a state of the electronic component 80 including a portion that contacts an upper surface of the circuit board.

Further, positioning hole 71 is provided at a specified position of circuit board 70. Electronic component 80 further includes pin section 84a that is inserted into positioning hole 71. The reference section (first reference section 84) includes regulating surface 84b that contacts an upper surface of circuit board 70 when pin section 84a is inserted by a specified amount into positioning hole 71, such that relative movement of pin section 84a with respect to positioning hole 71 is regulated. Measuring device 50 measures the position of at least one reference point 91 set on regulating surface 84b of the multiple reference points 91. According to such a configuration, electronic component 80 is positioned with respect to circuit board 70 by pin section 84a being inserted into positioning hole 71. With such an electronic component 80, regulating surface 84b contacts an upper surface of circuit board 70 so as to regulate relative movement of pin section 84a with respect to positioning hole 71 such that pin 84a is not inserted into positioning hole 71 by greater than the specified amount. Also, first reference section 84 of electronic component 80 is configured to include the above regulating surface 84b, and measuring device 50 measures the positions of reference points 91 set on regulating surface 84b among the multiple reference points 91. Thus, because calculations are made based on reference points 91 of regulating surface 84b that reliably contact an upper surface of circuit board 70 when reference surface 86 is mounted on circuit board 70, it is possible to determine the suitability of electronic component 80 with greater accuracy.

Also, stopping hole 72 that pierces circuit board 70 in the thickness direction is provided in circuit board 70. Electronic component 80 further includes stopping claw 85a that is inserted through stopping hole 72 and that engages with a lower surface of circuit board 70 to prevent pin section 84a inserted into positioning hole 71 from coming out. According to such a configuration, electronic component 80 includes stopping claw 85a that prevents pin section 84a inserted into positioning hole 71 from coming out, such that the posture of electronic component 80 after being mounted on circuit board 70 is maintained. In other words, electronic component 80 is maintained in a stable posture with respect to circuit board 70 by regulating surface 84b contacting an upper surface of circuit board 70 and stopping claw 85a engaging with a lower surface of circuit board 70, before the multiple electrodes 82 are soldered. With such an electronic component 80, it is necessary that the mounting state on circuit board 70 be such that all of the multiple electrodes are in a state to be electrically connectable to an upper surface of circuit board 70 such that solder defects do not occur, therefore it is especially important to determine suitability based on the positional relationship between regulating surface 84b and the multiple electrodes 82. Thus, it is especially effective to apply the present disclosure to electronic component 80 that includes regulating surface 84b and stopping claw 85a.

Further, each of the multiple electrodes 82 is lined up in a row in a horizontal direction. The reference section (first reference section 84 and second reference section 85) is arranged in a line with the multiple electrodes 82 when viewing electronic component 80 from above. According to such a configuration, first reference section 84 and second reference section 85 are arranged in a row with the multiple electrodes 82 that are arranged in a horizontal line. Thus, compared to a case in which first reference section 84 and second reference section 85 are set on a side of component main body 81, the multiple reference points 91 are close to the position of the measurement points 92 set on each of the multiple electrodes 82. Therefore, when measuring the positions of the multiple reference marks 91 and the positions of the multiple measurement points 92, for example, it is possible to perform measuring operations in one set of movements such that position measurement is performed efficiently. Also, because it is possible to make the error arising due to the distance from reference point 91 to measurement point 92 small, the accuracy of suitability determination is improved.

Component determination device Dp determines whether an electronic component 80 is suitable to be mounted on a circuit board 70. Electronic component 80 includes: component main body 81; multiple electrodes 82 lined up in a row in the horizontal direction; and a reference section (first reference section 84, second reference section 85) that is formed as a different member to the multiple electrodes 82 and that is arranged lined up on the same row as the multiple electrodes when the electronic component 80 is viewed from above. Component determination device Dp includes: measuring device 50 configured to measure positions of multiple reference points 91 set on the reference section (first reference section 84 and second reference section 85) and a position of measurement point 92 set on each of the multiple electrodes 82; plane calculating section 63 configured to calculate reference plane 86 representing a position of the upper surface of the circuit board 70 with respect to component main body 81 when the electronic component 80 is mounted on the circuit board 70 based on the positions of the multiple reference points 91; and suitability determining section 64 configured to determine whether the electronic component 80 is suitable based on a distance between reference plane 86 and the multiple measurement points 92.

A component determination method (S30) determines whether an electronic component 80 is suitable to be mounted on a circuit board 70. Electronic component 80 includes: component main body 81; multiple electrodes 82 lined up in a row in the horizontal direction; and a reference section (first reference section 84, second reference section 85) that is formed as a different member to the multiple electrodes 82 and that is arranged lined up on the same row as the multiple electrodes when the electronic component 80 is viewed from above. The component determination method (S30) includes: measuring positions of multiple reference points 92 set on the reference section (first reference section 84, second reference section 85) and a position of measurement point 92 set on each of the multiple electrodes 82; calculating reference plane 86 representing a position of the upper surface of circuit board 70 with respect to component main body 81 when electronic component 80 is mounted on circuit board 70 based on the positions of the multiple reference points 92; and determining whether the electronic component 80 is suitable based on a distance between reference plane 86 and the multiple measurement points 92.

According to such a configuration, it is determined whether the electronic component 80 is suitable, the electronic component 80 including a portion arranged lined up in a row with multiple electrodes arranged lined up in a horizontal direction. Also, electronic component 80, for having suitability determined, is set with multiple reference points 91 on first reference section 84 arranged lined up in a row with the multiple electrodes 80. Further, reference plane 86 calculated based on the multiple reference points 91 is an imaginary plane on the upper surface of circuit board 70 in a case in which electronic component 80 is hypothetically mounted on circuit board 70. Because reference plane 86 is calculated based on the multiple reference points 91, it is possible to calculate a more appropriate reference plane 86. Also, the suitability of electronic component 80 is determined based on the distance between reference plane 86 and the multiple measurement points 92. Thus, it is possible to reflect the position of first reference section 84 and second reference section 85 close to the electrode 82 when determining whether the electronic component 80 is suitable. Accordingly, it is possible to improve the accuracy of determining whether the electronic component 80 is suitable in accordance with a state of the electronic component 80 including a portion arranged lined up in a row with multiple electrodes 82.

Further, by first reference section 84 and second reference section 85 being arranged lined up in a row with the multiple electrodes 82 that are lined up in a row in a horizontal direction, compared to a case in which first reference section 84 and second reference section 85 are set on a side of component main body 81, the multiple reference points 91 are close to the position of the measurement points 92 set on each of the multiple electrodes 82. Therefore, when measuring the positions of the multiple reference marks 91 and the positions of the multiple measurement points 92, for example, it is possible to perform measuring operations in one set of movements such that position measurement is performed efficiently. Also, because it is possible to make the error arising due to the distance from reference point 91 to measurement point 92 small, the accuracy of suitability determination is improved.

Also, the reference section (second reference section 85) is arranged between two adjacent electrodes 82 among the multiple electrodes 82. According to such a configuration, at least a portion of the multiple reference points 91 set on second reference section 85 can be set next to a measurement point set on each of the multiple electrodes 82. By this, because it is possible to make the error arising due to the distance from reference point 91 to measurement point 92 small, the accuracy of suitability determination is improved.

Also, the reference section (first reference section 84) is a portion of connecting member 83 that connects the multiple electrodes 82 to each other at a position separated from component main body 81. According to such a configuration, connecting member 83, for example, is used as a reinforcing member that stabilizes the shape of the multiple electrodes 82, or as a portion to be gripped during mounting processing. By providing first reference section 84 on connecting member 83 that is close to the multiple electrodes 82 in this manner, it is possible to arrange the multiple reference points 91 close to the multiple measurement points 92, thereby improving the efficiency of position measurement.

Alternative Embodiment
Reference Section

In the present embodiment, the reference section (first reference section 84, second reference section 85) contacts the upper surface of circuit board 70, and is arranged lined up in a row with the multiple electrodes 82. However, the reference section of electronic component 80 on which reference points 91 are set may be configured to be outside lead row F, so long as the reference section is a portion that contacts the upper surface of circuit board 70.

Figure 7:
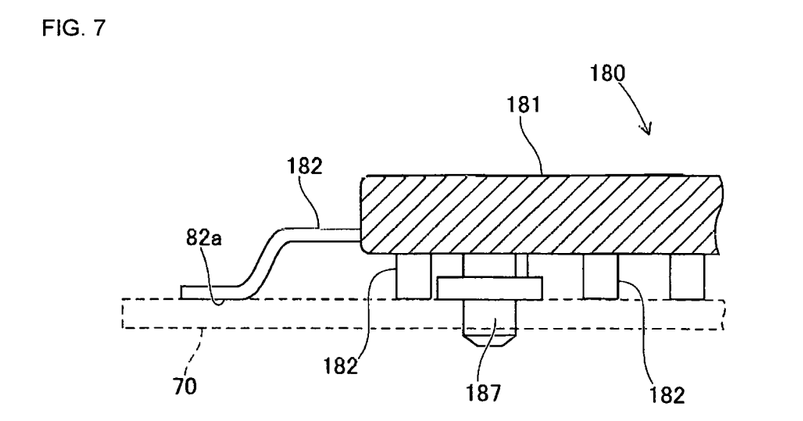
FIG. 7 is a side view of an electronic component in an alternative embodiment.
Figure 8:
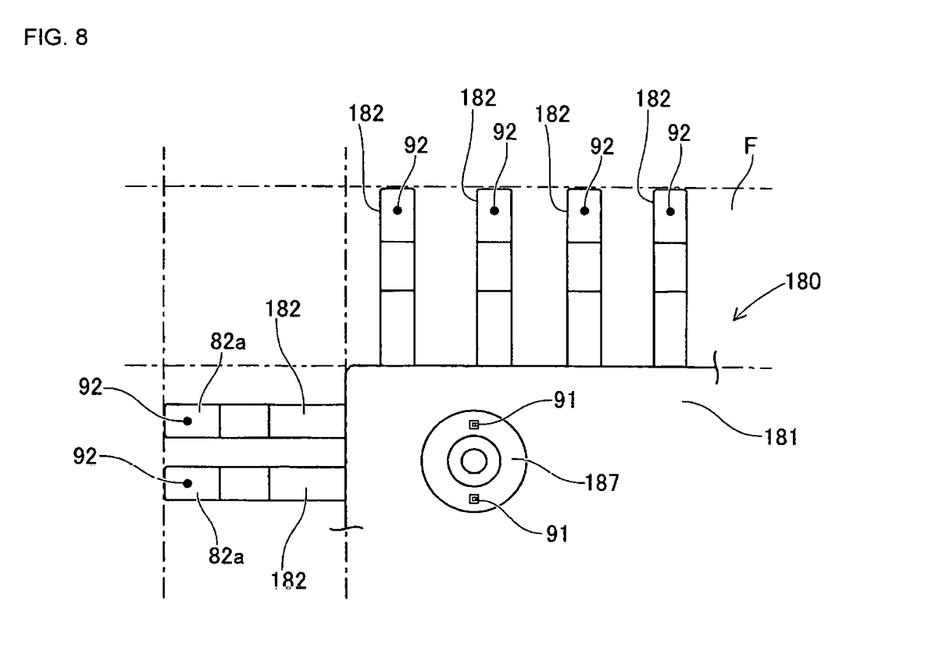
FIG. 8 is a bottom view showing a reference point and a measurement point set on the electronic component of FIG. 7.

Specifically, as shown in FIG. 7, electronic component 180 may be configured such that pin member 187 that protrudes downwards from the lower surface of component main body 181 is the reference section. As shown in FIG. 8, pin member 187 is arranged at a position outside of lead row F configured by the multiple electrodes 182 lined up in a row in the horizontal direction. For example, a tip section of pin member 187 is inserted into positioning hole 71 of circuit board 70 so as to position electronic component 180 with respect to circuit board 70.

Component determination device Dp that determines suitability for such an electronic component 180 sets multiple reference points 91 on a portion of pin member 187 that contacts the upper surface of circuit board 70, and sets multiple measurement points 92 on a lower surface of the multiple electrodes 82. With such a configuration too, it is possible to determine the suitability of electronic component 180 based on the distance between reference plane 86 calculated from the multiple reference points 91 and the multiple measurement points 92.

Also, the reference section of electronic component 80 on which reference points 91 are set may be configured as a portion that does not contact circuit board 70, so long as the reference section is arranged lined up in a row with the multiple electrodes 82 when viewing the electronic component 80 from above. That is, component determination device Dp may set a portion of a member positioned inside lead row F as a reference section, and set multiple reference points 91 on that reference section. For example, a horizontal plane separated by a specified distance from the upper surface of circuit board 70 may be formed on a lower section of connecting member 83 that connects adjacent electrodes 82 and multiple reference points 91 may be set on that horizontal plane.

According to this configuration, reference plane 86 is calculated based on the multiple reference points 91 set on the horizontal plane used as a reference that is formed on connecting member 83. Further, by adding the above specified distance and tolerance range Tc to reference plane 86, it is possible to perform suitability determination of an electronic component 80 in a similar manner to the main embodiment. According to such a configuration, reference points 91 are positioned inside lead row F, and, for example, compared to a case in which reference points 91 are set on a lower surface of component main body 81, because the reference points 91 can be set close to measurement points 92, the error when calculating reference plane 86 can be reduced.

Positioning

Electronic component 80 used as an example in the above embodiment is positioned in the XY directions with respect to circuit board 70 by pin section 84a being inserted into positioning hole 71 of circuit board 70. When determining the suitability of such an electronic component 80, component determination device Dp may be configured to perform inspection of the relative position of electrodes 82 with respect to pin section 84a in addition to relative position inspection of electrodes 82 with respect to reference plane 86 (suitability determining process of main embodiment).

Measurement device 50 of component determination device Dp configured as described above may further measure the position of pin section 84a of electronic component 80. Further, suitability determining section 64 may determine the suitability of the electronic component 80 based on the relative position of the multiple measurement points 92 on reference plane 86 with respect to the position of pin section 84a. That is, suitability determining section 64 may determine the suitability of the electronic component 80 based on the relative position in the XY directions of the multiple measurement with respect to pin section 84a so long as reference plane 86 is a horizontal plane.

Electronic component 80 configured as described above is positioned by pin section 84a being inserted into positioning hole 71 of circuit board 70. Therefore, with such an electronic component 80, it is necessary to have a specified positional relationship between pin section 84a and each of the multiple electrodes 82 such that soldering defects do not occur. Here, by further performing position inspection of electrodes 82 as above, it is possible to determine the suitability of electronic component 80 with greater accuracy.

Also, in the main embodiment, positioning hole 71 is set at a specified position on circuit board 70, and electronic component 80 is provided with pin section 84a that is inserted into positioning hole 71. However, the relationship between positioning hole 71 and pin section 84a may be switched. That is, a pin section may be set at a specified position on circuit board 70, and the electronic component may have a positioning hole. The same effects are achieved with such a configuration as with the configuration of the first embodiment. However, as above, when performing suitability determination based on the relative position with respect to pin section 84a, pin section 84a must be arranged on the electronic component 80.

Others

Also, in the present embodiment, mounting head 33 is configured to include a chuck device that holds electronic component 80 with gripping claws. However, mounting head 33 may be configured to hold an electronic component via suction using a suction nozzle. Also, in the main embodiment, an example was described in which component determination device Dp is configured in electronic component mounter 1. However, component determination device Dp may be applied as a device for inspecting electronic components 80 that is external to electronic component mounter 1. The same effects are achieved with such a configuration as with the configuration of the first embodiment.

REFERENCE SIGNS LIST

1: electronic component mounter;
   10: board conveyance device; 20: component supply device;

30: component transfer device; 41: component camera; 42: board camera;
50: measuring unit; 51: laser emitter; 52: light receiver;
60: control device;
　61: mounting control section; 62: memory device;
　63: plane calculating section; 64: suitability determining section;
　67: input and output interface; 68: motor control circuit;
　69: imaging control circuit;
70: control board; 71: positioning hole; 72: locking hole;
80, 180: electronic component;
　81, 181: component main body;
　82, 182: electrode;
　　82a: lead lower surface;
　83: connecting member;
　84: first reference section; 84a: pin section; 84b: regulating surface;
　85: second reference section; 85a: locking claw; 85b: regulating surface;
　86: reference plane; 187: pin member (reference section);
91: reference point; 92: measurement point;
Dp: component determination device; Tc: tolerance range

The invention claimed is:

1. A component determination device for determining whether an electronic component is suitable to be mounted on a circuit board, the electronic component including a component main body, multiple electrodes, and a reference section that is formed as a different member to the multiple electrodes and that contacts an upper surface of the circuit board when the electronic component is mounted on the circuit board, the component determination device comprising:
a measuring device configured to measure positions of multiple reference points set on the reference section and a position of a measurement point set on each of the multiple electrodes; and
processing circuitry configured to
calculate a reference plane representing a position of the upper surface of the circuit board with respect to the component main body when the electronic component is mounted on the circuit board based on the positions of the multiple reference points measured by the measuring device; and
determine whether all of the multiple electrodes of electronic component contacts an upper surface of the circuit board based on a distance between the reference plane and the multiple measurement points.

2. The component determination device according to claim 1, wherein
one of a positioning hole or a pin section to be inserted into the positioning hole is provided at a specified position of the circuit board,
the electronic component includes the other of the positioning hole or the pin section,
the reference section includes a regulating surface configured to, when the pin section has been inserted by a predetermined amount into the positioning hole, contact the upper surface of the circuit board so as to regulate the relative movement of the pin section with respect to the positioning hole, and
the measuring device measures the position of at least one of the reference points set on the regulating surface among the multiple reference points.

3. The component determination device according to claim 2, wherein a locking hole is provided piercing the circuit board in a thickness direction, and
the electronic component includes a locking claw that is inserted into the locking hole and that locks on the lower surface of the circuit board to prevent the pin section that has been inserted into the positioning hole from coming out.

4. The component determination device according to claim 2, wherein
the positioning hole is provided at the regulating position of the circuit board,
the electronic component includes the pin section,
the measuring device also measures a position of the pin section at the electronic component, and
the processing circuitry determines whether the electronic component is suitable based on the relative position on the reference plane of the multiple measurement points with respect to the position of the pin section.

5. The component determination device according claim 1, wherein
each of the multiple electrodes is arranged lined up in a row in a horizontal direction, and
the reference section is arranged lined up on the same row of the multiple electrodes as seen from above the electronic component.

6. The component determination device according to claim 5, wherein
the reference section is arranged between two adjacent of the electrodes among the multiple electrodes.

7. The component determination device according to claim 1, wherein
the reference section is one portion of a connecting member that connects the multiple electrodes to each other at a position separated from the component main body.

8. The component determination device according claim 1, wherein
the measuring device includes a laser emitter that emits a laser light to measure the positions of the multiple reference points and the position of the measurement point set on each of the multiple electrodes.

9. A component determination device for determining whether an electronic component is suitable to be mounted on a circuit board, the electronic component including a component main body, multiple electrodes, and a reference section that is formed as a different member to the multiple electrodes and that is arranged lined up on the same row as the multiple electrodes when the electronic component is viewed from above, the component determination device comprising:
a measuring device configured to measure positions of multiple reference points set on the reference section and a position of a measurement point set on each of the multiple electrodes; and
processing circuitry configured to
calculate a reference plane representing a position of the upper surface of the circuit board with respect to the component main body when the electronic component is mounted on the circuit board based on the positions of the multiple reference points measured by the measuring device; and
determine whether all of the multiple electrodes of electronic component contacts an upper surface of the circuit board based on a distance between the reference plane and the multiple measurement points.

10. A component determination method for determining whether an electronic component is suitable to be mounted on a circuit board, the electronic component including a component main body, multiple electrodes, and a reference section that is formed as a different member to the multiple electrodes and that contacts an upper surface of the circuit board when the electronic component is mounted on the circuit board, the component determination method comprising:
  measuring positions of multiple reference points set on the reference section and a position of a measurement point set on each of the multiple electrodes;
  calculating a reference plane representing a position of the upper surface of the circuit board with respect to the component main body when the electronic component is mounted on the circuit board based on the measured positions of the multiple reference points; and
  determining whether all of the multiple electrodes of electronic component contacts an upper surface of the circuit board based on a distance between the reference plane and the multiple measurement points.

11. A component determination method for determining whether an electronic component is suitable to be mounted on a circuit board, the electronic component including a component main body, multiple electrodes, and a reference section that is formed as a different member to the multiple electrodes and that is arranged lined up on the same row as the multiple electrodes when the electronic component is viewed from above, the component determination method comprising:
  measuring positions of multiple reference points set on the reference section and a position of a measurement point set on each of the multiple electrodes;
  calculating a reference plane representing a position of the upper surface of the circuit board with respect to the component main body when the electronic component is mounted on the circuit board based on the measured positions of the multiple reference points; and
  determining whether all of the multiple electrodes of electronic component contacts an upper surface of the circuit board based on a distance between the reference plane and the multiple measurement points.

* * * * *